United States Patent
Suh

(10) Patent No.: US 11,303,023 B2
(45) Date of Patent: Apr. 12, 2022

(54) ANTENNA AND ELECTRONIC DEVICE INCLUDING THE SAME

(71) Applicant: Samsung Electronics Co., Ltd., Gyeonggi-do (KR)

(72) Inventor: Younghoon Suh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 24 days.

(21) Appl. No.: 17/005,460

(22) Filed: Aug. 28, 2020

(65) Prior Publication Data

US 2021/0066800 A1    Mar. 4, 2021

(30) Foreign Application Priority Data

Aug. 30, 2019    (KR) ........................ 10-2019-0107291

(51) Int. Cl.
*H01Q 5/371* (2015.01)
*H01Q 5/47* (2015.01)
*H01Q 1/38* (2006.01)
*H01Q 1/22* (2006.01)

(52) U.S. Cl.
CPC .......... *H01Q 5/371* (2015.01); *H01Q 1/2283* (2013.01); *H01Q 1/38* (2013.01); *H01Q 5/47* (2015.01)

(58) Field of Classification Search
CPC ........ H01Q 5/371; H01Q 1/2283; H01Q 1/38; H01Q 5/47; H01Q 1/243; H01Q 5/50; H01Q 5/335; H01Q 1/241; H01Q 23/00; H03H 2007/386; H03H 7/38
See application file for complete search history.

(56) References Cited

U.S. PATENT DOCUMENTS

| | | | |
|---|---|---|---|
| 8,358,989 B2 | 1/2013 | Kakuya et al. | |
| 8,725,098 B2 | 5/2014 | Shana'a et al. | |
| 2008/0136729 A1 | 6/2008 | Kang et al. | |
| 2010/0267350 A1* | 10/2010 | Kasha | H04B 1/0458 455/121 |

(Continued)

FOREIGN PATENT DOCUMENTS

| | | |
|---|---|---|
| KR | 10-2005-0014422 A | 2/2005 |
| KR | 10-0763994 B1 | 10/2007 |
| KR | 10-2019-0089955 A | 7/2019 |

OTHER PUBLICATIONS

International Search Report dated Dec. 2, 2020.

*Primary Examiner* — David E Lotter
(74) *Attorney, Agent, or Firm* — Cha & Reiter, LLC

(57) ABSTRACT

In an embodiment, an electronic device may include a housing having an inner space, a first printed circuit board including a wireless communication circuit, an antenna structure connected to the wireless communication circuit through a first electrical path, and a tunable circuit having a first resistance value and disposed on a second electrical path. The electronic device may further include a low-resistance circuit disposed on a third electrical path branched from the second electrical path, and including a resistor and an inductor, the resistor having a second resistance value determined based on the first resistance value, and the inductor having a constant inductance value and disposed between the resistor and the ground. The electronic device may also include at least one processor configured to control the tunable circuit.

20 Claims, 10 Drawing Sheets

(56) References Cited

U.S. PATENT DOCUMENTS

| | | | |
|---|---|---|---|
| 2011/0256841 A1* | 10/2011 | Kakuya | H04B 1/18 |
| | | | 455/334 |
| 2013/0154897 A1 | 6/2013 | Sorensen et al. | |
| 2016/0164180 A1 | 6/2016 | Suh | |
| 2018/0288203 A1 | 10/2018 | Jeon et al. | |
| 2019/0067821 A1 | 2/2019 | Kim et al. | |
| 2020/0091608 A1 | 3/2020 | Alpman et al. | |

* cited by examiner

ANTENNA AND ELECTRONIC DEVICE INCLUDING THE SAME

CROSS-REFERENCE TO RELATED APPLICATION(S)

This application is based on and claims priority under 35 U.S.C. 119 to Korean Patent Application No. 10-2019-0107291, filed on Aug. 30, 2019, in the Korean Intellectual Property Office, the disclosures of which are herein incorporated by reference in their entireties.

BACKGROUND

Field

Certain embodiments of the instant disclosure generally relate to an antenna and an electronic device including the same.

Description of Related Art

One of the current trends in the development of electronic devices to meet customer's demands is to provide a slim device body, that is, to reduce the thickness of the electronic device. In addition, such electronic devices are being developed to increase their stiffness, strengthen their design aspects, and differentiate their functional features from their competitors. Further, electronic devices are being developed to improve radiation performance of one or more antennas disposed in the device, which are essential for communication. Improved radiation performance may be accomplished by designing various structural aspects of the antenna.

The volume and number of antenna structures mounted in the electronic device may be determined depending on the frequency, bandwidth, and type of each wireless service deployed in the electronic device. For example, low band of about 700 MHz to 900 MHz, mid band of about 1700 MHz to 2100 MHz, high band of about 2300 MHz to 2700 MHz, and super-high frequency band of about 3 GHz to 100 GHz are used mainly as communication bands by regions around the world. In addition, various wireless communication services such as Bluetooth (BT), global positioning system (GPS), and wireless fidelity (WIFI) may be used. The electronic device requires a plurality of antennas in order to support the above-mentioned communication bands. But slimmed down electronic devices may have limited antenna mountable space, i.e., space where the antennas are mounted. To overcome this limitation, the electronic device may be designed to have antennas grouped by services having similar frequency bands.

Normally, an antenna used for voice/data communication (GPRS, WCDMA, or LTE), which is the main mode of communication of the electronic device, may be disposed at the lower portion of the electronic device, which has fewer metal parts that impair antenna performance. For example, in case of products for Europe, the bands to be implemented may be twenty four bands, that is, 2G (GSM850, EGSM, DCS, PCS), WCDMA (B1, B2, B5, B8), and LTE (B1, B2, B3, B4, B5, B7, B8, B12, B17, B18, B19, B20, B26, B38, B39, B40, B41). However, it is difficult to satisfy operator's specification, meet a specific absorption rate (SAR) criteria, and minimize human influence when all bands are implemented in one antenna. Thus, the antennas may be grouped together by at least two services having similar frequency bands. For example, one antenna available for 2G (GSM850, EGSM, DCS, PCS), WCDMA (B1, B2, B5, B8), and LTE (B1, B2, B3, B4, B5, B8, B12, B17, B18, B19, B20, B26, B39) and another antenna available for LTE (B7, B38, B40, B41) may be designed.

In certain cases, the antenna may be implemented by electrically connecting antenna structures (e.g., conductive structures or conductive patterns) disposed in the electronic device to communication modules. This antenna may be utilized as a multi-band antenna that operates in at least two different frequency bands. In this case, the antenna structures may be designed to be optimized for carrier aggregation (CA) (e.g., 2CA, 3CA, 4CA, etc.) or multi-input multi-output (MIMO).

When frequency shift is required for each operator or region, the multi-band antenna may shift its operating frequency band from a first frequency band to a second frequency band by using a tuner or tunable IC (e.g., a frequency shift circuit) disposed on an electrical path connecting the antenna structure and a wireless communication circuit.

A switch of the tunable IC may include a field effect transistor (FET) module and may further include an element having a certain internal resistance value (Ron). In general, an element having low internal resistance value should be used for easy frequency shift. However, in this case, the frequency shift may be difficult because a parasitic capacitance value (Coff) inside the switch may be large. Therefore, it is inevitable to use an element having a particular internal resistance value or higher. Unfortunately, because of this element, the gain of the antenna including the tunable IC may be reduced, and also the radiation performance of the antenna may be negatively impacted.

SUMMARY

Certain embodiments of the disclosure may provide an electronic device including an antenna.

According to an embodiment of the disclosure, an electronic device may include a housing having an inner space, a first printed circuit board (PCB) disposed in the inner space of the housing and including a wireless communication circuit, an antenna structure connected to the wireless communication circuit through a first electrical path, a tunable circuit having a first resistance value and disposed on a second electrical path branched from the first electrical path and connected to a ground, a low-resistance circuit disposed on a third electrical path branched from the second electrical path and connected to the ground, and including a resistor and an inductor, the resistor having a second resistance value determined based on the first resistance value, and the inductor having a constant inductance value and disposed between the resistor and the ground, and at least one processor configured to control the tunable circuit to enable the wireless communication circuit to transmit and/or receive a wireless signal through a second frequency band shifted from a first frequency band using the antenna structure.

According to an embodiment of the disclosure, an electronic device may include a housing having an inner space, a printed circuit board (PCB) disposed in the inner space of the housing and including a wireless communication circuit, an antenna structure electrically connected to the wireless communication circuit, at least one intermediate circuit having a first resistance value, connected to the antenna structure in parallel to the wireless communication circuit, and grounded to a ground, and a low-resistance circuit connected to the at least one intermediate circuit in parallel, grounded to the ground, and including a resistor and an inductor, the resistor having a second resistance value determined based on the first resistance value, and the inductor having a constant inductance value and disposed between the resistor and the ground.

Additional aspects will be set forth in part in the description which follows and, in part, will be apparent from the description, or may be learned by practice of the presented embodiments.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

Certain embodiments of the disclosure may provide an electronic device that includes an antenna having its radiation performance improved by a change in its circuit structure.

Certain embodiments of the disclosure may provide an electronic device that includes an antenna that allows for easy frequency shift without degradation of performance.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions are omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
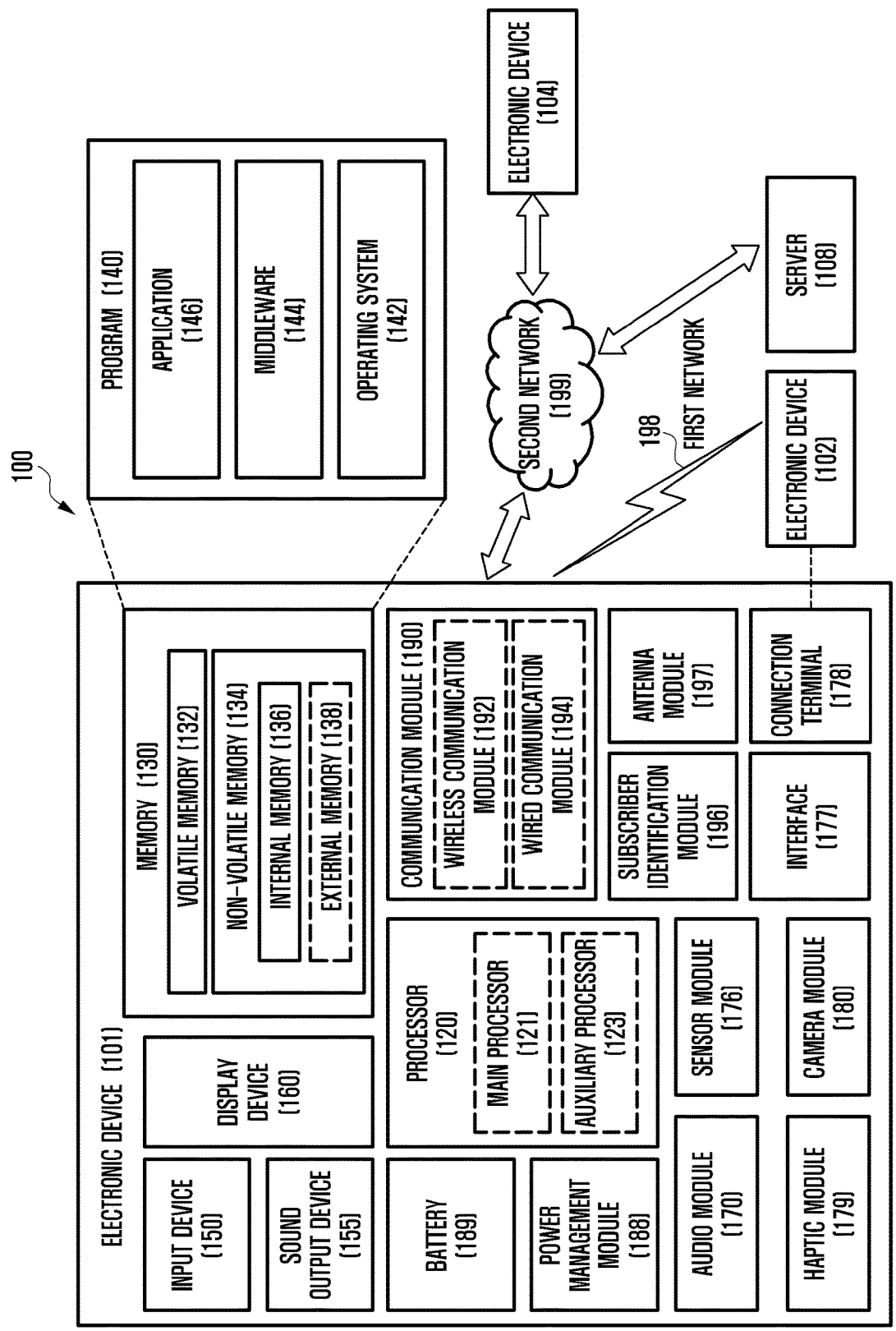
FIG. 1 is a block diagram illustrating an electronic device in a network environment according to an embodiment of the disclosure.

FIG. 1 illustrates an electronic device in a network environment according to an embodiment of the disclosure.

Referring to FIG. 1, an electronic device 101 in a network environment 100 may communicate with an electronic device 102 via a first network 198 (e.g., a short-range wireless communication network), or an electronic device 104 or a server 108 via a second network 199 (e.g., a long-range wireless communication network). The electronic device 101 may communicate with the electronic device 104 via the server 108. The electronic device 101 includes a processor 120, memory 130, an input device 150, an audio output device 155, a display device 160, an audio module 170, a sensor module 176, an interface 177, a haptic module 179, a camera module 180, a power management module 188, a battery 189, a communication module 190, a subscriber identity module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 or external memory 138.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The audio output device 155 may output sound signals to the outside of the electronic device 101. The audio output device 155 may include, for example, a speaker or a receiver. The speaker may be used for general purposes, such as playing multimedia or playing record, and the receiver may be used for incoming calls. The receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. The display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input device 150, or output the sound via the audio output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high definition multimedia interface (HDMI), a universal serial bus (USB) interface, a secure digital (SD) card interface, or an audio interface.

A connection terminal 178 may include a connector via which the electronic device 101 may be physically connected with the external electronic device (e.g., the electronic device 102). The connection terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture a still image or moving images. The camera module 180 may include one or more lenses, image sensors, image signal processors, or flashes.

The power management module 188 may manage power supplied to the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or a standard of the Infrared Data Association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The antenna module 197 may transmit or receive a signal or power to or from the outside (e.g., the external electronic device) of the electronic device 101. The antenna module 197 may include an antenna including a radiating element composed of a conductive material or a conductive pattern formed in or on a substrate (e.g., a PCB). The antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

An electronic device according to an embodiment may be one of various types of electronic devices. The electronic device may include a portable communication device (e.g., a smart phone), a computer device, a portable multimedia device, a portable medical device, a camera, a wearable device, or a home appliance. However, the electronic device is not limited to any of those described above.

Various embodiments of the disclosure and the terms used herein are not intended to limit the technological features set forth herein to particular embodiments and include various changes, equivalents, or replacements for a corresponding embodiment.

With regard to the description of the drawings, similar reference numerals may be used to refer to similar or related elements.

A singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases.

As used herein, such terms as "1st" and "2nd", or "first" and "second" may be used to simply distinguish a corresponding component from another, and does not limit the components in other aspect (e.g., importance or order). If an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

The term "module" may include a unit implemented in hardware, software, or firmware, and may interchangeably be used with other terms, for example, "logic", "logic block", "part", or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
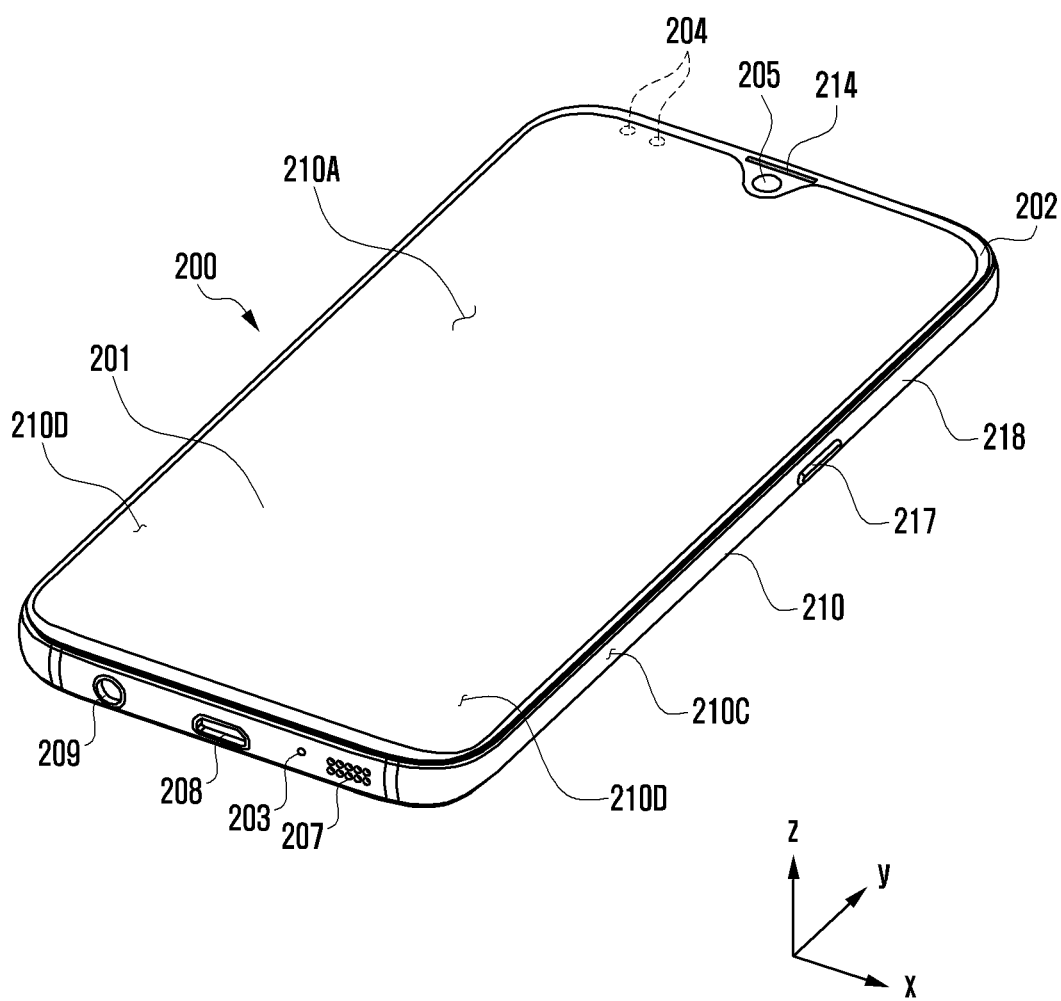
FIG. 2A is a perspective view showing a front surface of an electronic device according to an embodiment of the disclosure.
Figure 2B:
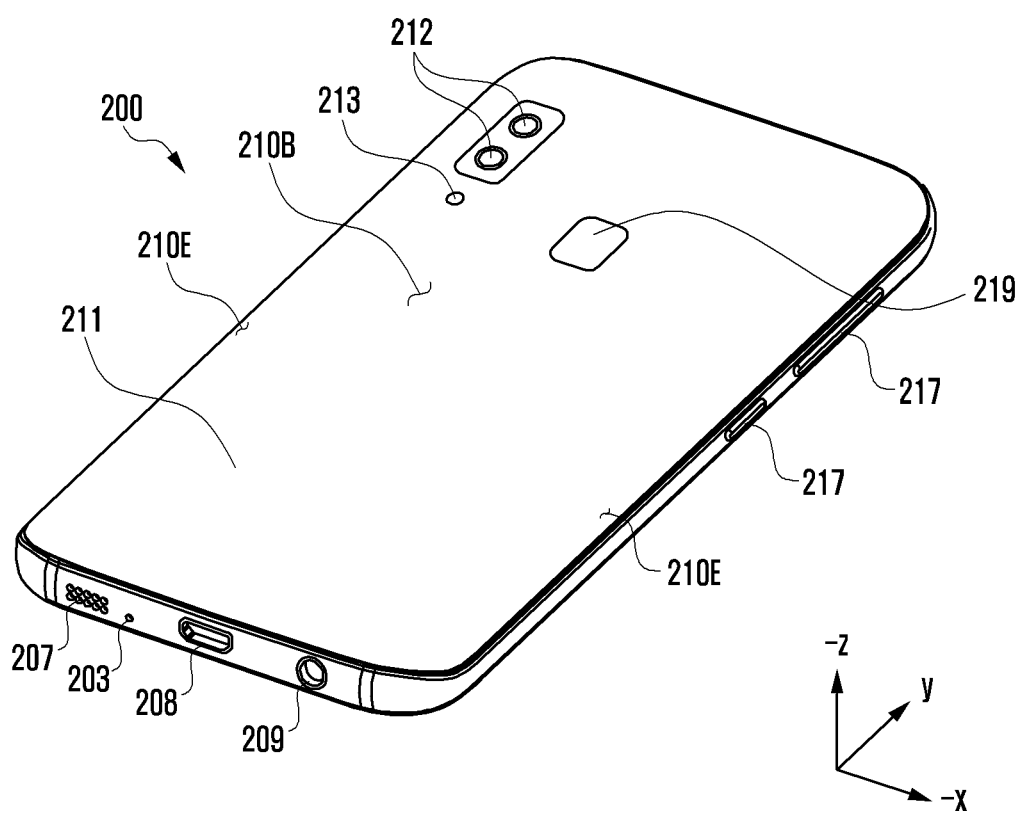
FIG. 2B is a perspective view showing a rear surface of an electronic device according to an embodiment of the disclosure.

FIG. 2A illustrates a perspective view showing a front surface of a mobile electronic device 200 according to an embodiment, and FIG. 2B illustrates a perspective view showing a rear surface of the mobile electronic device 200 shown in FIG. 2A.

Referring to FIGS. 2A and 2B, the mobile electronic device 200 may include a housing 210 that includes a first surface (or front surface) 210A, a second surface (or rear surface) 210B, and a lateral surface 210C that surrounds a space between the first surface 210A and the second surface 210B. The housing 210 may refer to a structure that forms a part of the first surface 210A, the second surface 210B, and the lateral surface 210C. The first surface 210A may be formed of a front plate 202 (e.g., a glass plate or polymer plate coated with a variety of coating layers) at least a part of which is substantially transparent. The second surface 210B may be formed of a rear plate 211 which is substantially opaque. The rear plate 211 may be formed of, for example, coated or colored glass, ceramic, polymer, metal (e.g., aluminum, stainless steel (STS), or magnesium), or any combination thereof. The lateral surface 210C may be formed of a lateral bezel structure (or "lateral member") 218 which is combined with the front plate 202 and the rear plate 211 and includes a metal and/or polymer. The rear plate 211 and the lateral bezel structure 218 may be integrally formed and may be of the same material (e.g., a metallic material such as aluminum).

The front plate 202 may include two first regions 210D disposed at long edges thereof, respectively, and bent and extended seamlessly from the first surface 210A toward the rear plate 211. Similarly, the rear plate 211 may include two second regions 210E disposed at long edges thereof, respectively, and bent and extended seamlessly from the second surface 210B toward the front plate 202. The front plate 202 (or the rear plate 211) may include only one of the first regions 210D (or of the second regions 210E). The first regions 210D or the second regions 210E may be omitted in part. When viewed from a lateral side of the mobile electronic device 200, the lateral bezel structure 218 may have a first thickness (or width) on a lateral side where the first region 210D or the second region 210E is not included, and may have a second thickness, being less than the first thickness, on another lateral side where the first region 210D or the second region 210E is included.

The mobile electronic device 200 may include at least one of a display 201, audio modules 203, 207 and 214, sensor modules 204 and 219, camera modules 205, 212 and 213, a key input device 217, a light emitting device, and connector holes 208 and 209. The mobile electronic device 200 may omit at least one (e.g., the key input device 217 or the light emitting device) of the above components, or may further include other components.

The display 201 may be exposed through a substantial portion of the front plate 202, for example. At least a part of the display 201 may be exposed through the front plate 202 that forms the first surface 210A and the first region 210D of the lateral surface 210C. Outlines (i.e., edges and corners) of the display 201 may have substantially the same form as those of the front plate 202. The spacing between the outline of the display 201 and the outline of the front plate 202 may be substantially unchanged in order to enlarge the exposed area of the display 201.

A recess or opening may be formed in a portion of a display area of the display 201 to accommodate at least one of the audio module 214, the sensor module 204, the camera module 205, and the light emitting device. At least one of the audio module 214, the sensor module 204, the camera module 205, the fingerprint sensor (not shown), and the light emitting element may be disposed on the back of the display area of the display 201. The display 201 may be combined with, or adjacent to, a touch sensing circuit, a pressure sensor capable of measuring the touch strength (pressure), and/or a digitizer for detecting a stylus pen. At least a part of the sensor modules 204 and 219 and/or at least a part of the key input device 217 may be disposed in the first region 210D and/or the second region 210E.

The audio modules 203, 207 and 214 may correspond to a microphone hole 203 and speaker holes 207 and 214, respectively. The microphone hole 203 may contain a microphone disposed therein for acquiring external sounds and, in a case, contain a plurality of microphones to sense a sound direction. The speaker holes 207 and 214 may be classified into an external speaker hole 207 and a call receiver hole 214. The microphone hole 203 and the speaker holes 207 and 214 may be implemented as a single hole, or a speaker (e.g., a piezo speaker) may be provided without the speaker holes 207 and 214.

The sensor modules 204 and 219 may generate electrical signals or data corresponding to an internal operating state of the mobile electronic device 200 or to an external environmental condition. The sensor modules 204 and 219 may include a first sensor module 204 (e.g., a proximity sensor) and/or a second sensor module (e.g., a fingerprint sensor) disposed on the first surface 210A of the housing 210, and/or a third sensor module 219 (e.g., a heart rate monitor (HRM) sensor) and/or a fourth sensor module (e.g., a fingerprint sensor) disposed on the second surface 210B of the housing 210. The fingerprint sensor may be disposed on the second surface 210B as well as the first surface 210A (e.g., the display 201) of the housing 210. The electronic device 200 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 and 213 may include a first camera device 205 disposed on the first surface 210A of the electronic device 200, and a second camera device 212 and/or a flash 213 disposed on the second surface 210B. The camera module 205 or the camera module 212 may include one or more lenses, an image sensor, and/or an image signal processor. The flash 213 may include, for example, a light emitting diode or a xenon lamp. Two or more lenses (infrared cameras, wide angle and telephoto lenses) and image sensors may be disposed on one side of the electronic device 200.

The key input device 217 may be disposed on the lateral surface 210C of the housing 210. The mobile electronic device 200 may not include some or all of the key input device 217 described above, and the key input device 217 which is not included may be implemented in another form such as a soft key on the display 201. The key input device 217 may include the sensor module disposed on the second surface 210B of the housing 210.

The light emitting device may be disposed on the first surface 210A of the housing 210. For example, the light emitting device may provide status information of the electronic device 200 in an optical form. The light emitting device may provide a light source associated with the operation of the camera module 205. The light emitting device may include, for example, a light emitting diode (LED), an IR LED, or a xenon lamp.

The connector holes 208 and 209 may include a first connector hole 208 adapted for a connector (e.g., a USB connector) for transmitting and receiving power and/or data to and from an external electronic device, and/or a second connector hole 209 adapted for a connector (e.g., an earphone jack) for transmitting and receiving an audio signal to and from an external electronic device.

Some sensor modules 205 of camera modules 205 and 212, some sensor modules 204 of sensor modules 204 and 219, or an indicator may be arranged to be exposed through a display 201. For example, the camera module 205, the sensor module 204, or the indicator may be arranged in the internal space of an electronic device 200 so as to be brought into contact with an external environment through an opening of the display 201, which is perforated up to a front plate 202. In another embodiment, some sensor modules 204 may be arranged to perform their functions without being visually exposed through the front plate 202 in the internal space of the electronic device. For example, in this case, an area of the display 201 facing the sensor module may not require a perforated opening.

Figure 3:
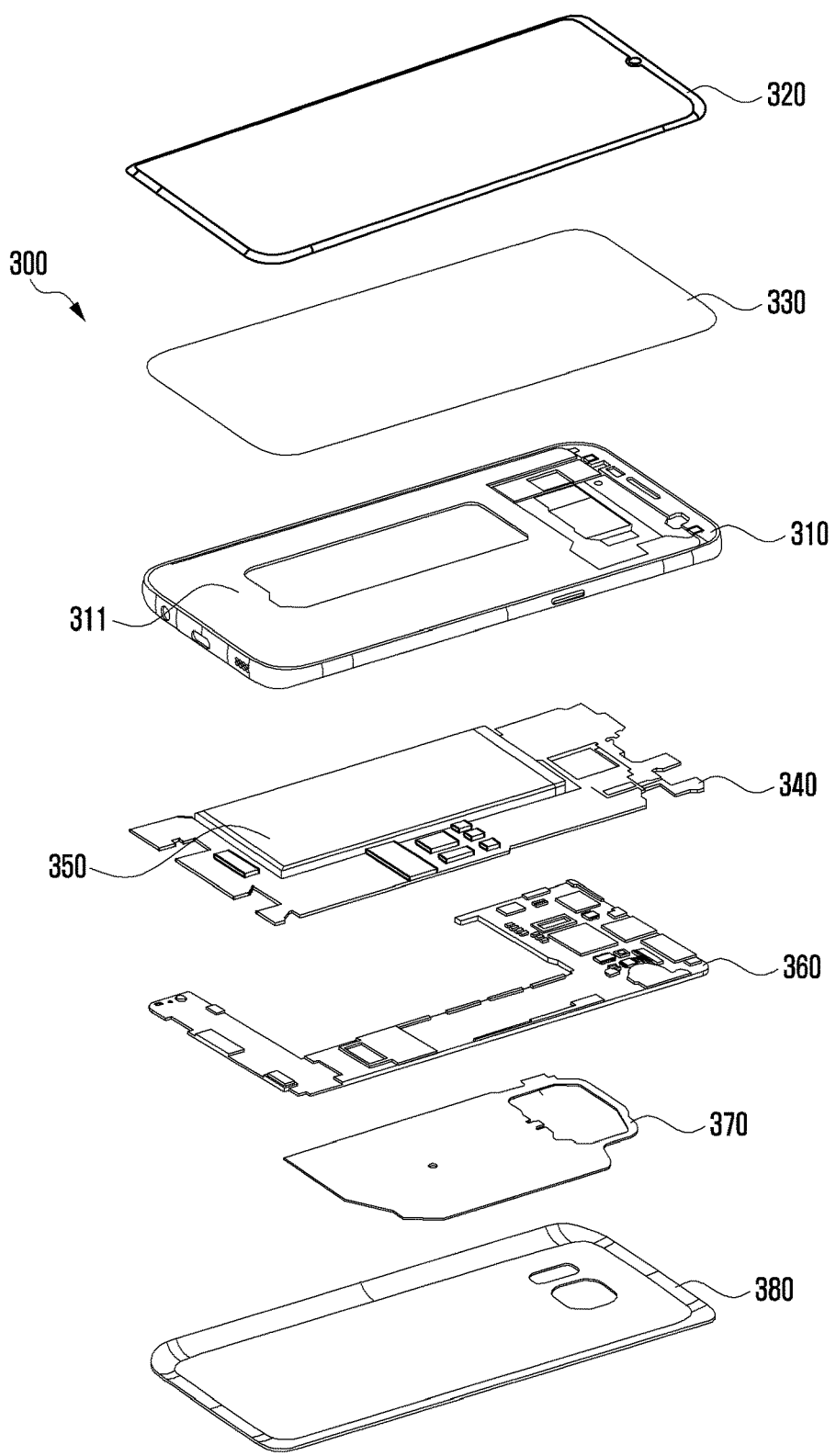
FIG. 3 is an exploded perspective view showing an electronic device according to an embodiment of the disclosure.

FIG. 3 illustrates an exploded perspective view showing a mobile electronic device shown in FIG. 2a according to an embodiment of the disclosure.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 200 shown in FIG. 2a or FIG. 2b, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
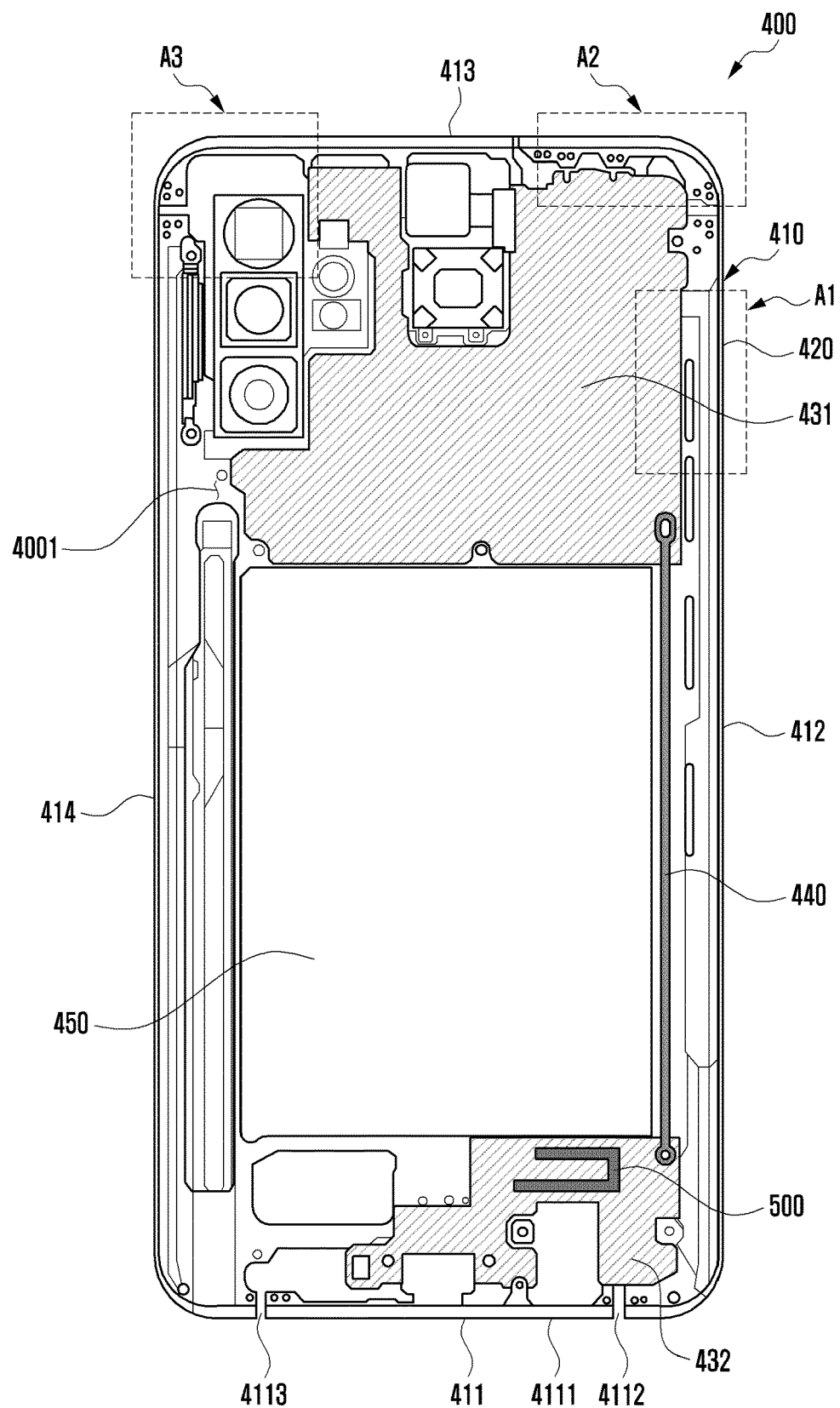
FIG. 4 is a plan view showing an internal configuration of an electronic device including an antenna structure according to an embodiment of the disclosure.

FIG. 4 is a plan view showing an internal configuration of an electronic device 400 including an antenna structure 500 according to an embodiment of the disclosure. FIG. 4 shows the internal configuration of the electronic device 400 from which the rear cover (e.g., the rear plate 211 in FIG. 2B) is removed.

The electronic device 400 shown in FIG. 4 may be similar, at least in part, to the electronic device 101 shown in FIG. 1, the electronic device 200 shown in FIG. 2A, or the electronic device 300 shown in FIG. 3, or may include other embodiments of the electronic device.

Referring to FIG. 4, the electronic device 400 may include a housing structure 410 that includes a front cover (e.g., the front plate 202 in FIG. 2A), a rear cover (e.g., the rear plate 211 in FIG. 2B) facing in the opposite direction to the front cover, and a lateral member 420 surrounding an inner space 4001 between the front and rear covers. According to an embodiment, the lateral member 420 may include, at least in part, a conductive member.

According to an embodiment, the lateral member 420 may include a first lateral surface 411 having a first length, a second lateral surface 412 extended perpendicularly from the first lateral surface 411 and having a second length greater than the first length, a third lateral surface 413 extended from the second lateral surface in parallel with the first lateral surface 411 and having the first length, and a fourth lateral surface 414 extended from the third lateral surface 413 in parallel with the second lateral surface 412 and having the second length.

According to an embodiment, the electronic device 400 may include a first printed circuit board (PCB) 431 (also referred to as a main substrate) disposed in the inner space 4001, and a second PCB 432 (also referred to as a sub-substrate) disposed in the inner space 4001 and spaced apart from the first PCB 431. According to an embodiment, the first PCB 431 may include at least one wireless communication circuit (e.g., the wireless communication module 192 in FIG. 1). According to an embodiment, the first PCB 431 may be disposed in a region (e.g., near the third lateral surface 413) where electronic components (e.g., at least one camera module, at least one sensor module, and/or a speaker module) of the electronic device 400 are disposed. According to an embodiment, the second PCB 432 may include the antenna structure 500. According to an embodiment, the antenna structure 500 may be connected to the first PCB 431 through an electrical connection member 440 and disposed in a region adjacent to the first lateral surface 411, which is spaced apart from the region where the first PCB 431 is disposed. Accordingly, a specific absorption rate (SAR) caused by the user's head during voice calls may be reduced, and decrease in radiation performance caused by the human body may be reduced.

According to an embodiment, the antenna structure 500 may include a conductive pattern formed on the second PCB 432. In another embodiment, the antenna structure 500 may include a conductive metal or flexible PCB (FPCB) attached to the second PCB 432. In still another embodiment, the antenna structure 500 may include a laser direct structuring (LDS) pattern formed on a dielectric carrier disposed near the second PCB 432 in the inner space 4001 of the electronic device 400. In yet another embodiment, the antenna structure 500 may include an additional member disposed on the second PCB 432 and electrically connected (e.g., directly connected or indirectly connected through coupling) to the above-mentioned LDS pattern, conductive metal, or FPCB.

According to an embodiment, the electronic device 400 may include a battery 450 disposed between the first PCB 431 and the second PCB 432. According to an embodiment, the battery 450 may be disposed so as not to be overlapped with the first PCB 431 and/or the second PCB 432. In another embodiment, the battery 450 may be disposed to be overlapped at least in part with the first PCB 431 and/or the second PCB 432.

According to an embodiment, the antenna structure 500 may be replaced with at least a portion of the lateral member 420 that is a conductive member electrically connected to the second PCB 432. For example, the electronic device 400 may include at least one antenna structure 500 that is implemented by the first lateral surface 411 of the lateral member 420. According to an embodiment, the antenna structure 500 may include a conductive portion 4111 of the first lateral surface 411 that is interposed between non-conductive portions 4112 and 4113 of the first lateral surface 411. The non-conductive portions 4112 and 4113 of the first lateral surface 411 may be spaced apart from each other, and thus the conductive portion 4111 is electrically isolated by the non-conductive portions 4112 and 4113. According to an embodiment, the antenna structure 500 may be electrically connected to the wireless communication circuit (e.g., the wireless communication module 192 in FIG. 1), mounted on the first PCB 431, through the second PCB 432. In another embodiment, the antenna structure 500 may be directly electrically connected to the wireless communication circuit (e.g., the wireless communication module 192 in FIG. 1) mounted on the first PCB 431.

According to an embodiment, the electronic device 400 may further include an additional antenna structure in addition to the antenna structure 500 mounted on or disposed near the second PCB 432. For example, the additional antenna structure may be disposed at an upper portion A1 of the second lateral surface 412, at a corner A2 between the second and third lateral surfaces 412 and 413, and/or at a corner A3 between the third and fourth lateral surfaces 413 and 414 in the inner space 4001 of the electronic device 400. In another embodiment, the additional antenna structure may be implemented using at least a portion of the second lateral surface 412, the third lateral surface 413, and/or the fourth lateral surface 414 each including a conductive member. In this case, such antenna structures may be electrically connected to the wireless communication circuit (e.g., the wireless communication module 192 in FIG. 1) and also designed to operate in different frequency bands or operate in a particular environment such as carrier aggregation (CA), multi-input multi-output (MIMO), or diversity.

According to an embodiment, in case where the antenna structure 500 is spaced apart from the wireless communication circuit (e.g., the wireless communication module 192 in FIG. 1), the electronic device 400 may include the electrical connection member 440 disposed to electrically connect the first and second PCBs 431 and 432. According to an embodiment, the electrical connection member 440 may include a radio frequency (RF) coaxial cable or an FPCB-type RF cable (FRC).

According to an embodiment of the disclosure, the electronic device 400 may include at least one intermediate circuit disposed on an electrical path that connects the wireless communication circuit (e.g., the wireless communication module 192 in FIG. 1 or the transceiver 471 in FIG. 5) and the antenna structure 500. According to an embodiment, the intermediate circuit may include a tuner, a tunable integrated circuit (tunable IC), or a matching circuit, each of which operates to shift the operating frequency band through impedance matching of the antenna. According to an embodiment, the electronic device 400 may include a low-resistance circuit (e.g., a low-resistance circuit 700 in FIG. 5) connected in parallel with an internal resistor of the intermediate circuit, thereby reducing the total resistance value and improve gain of the antenna.

Hereinafter, the configuration of the low-resistance circuit will be described in detail.

Figure 5:
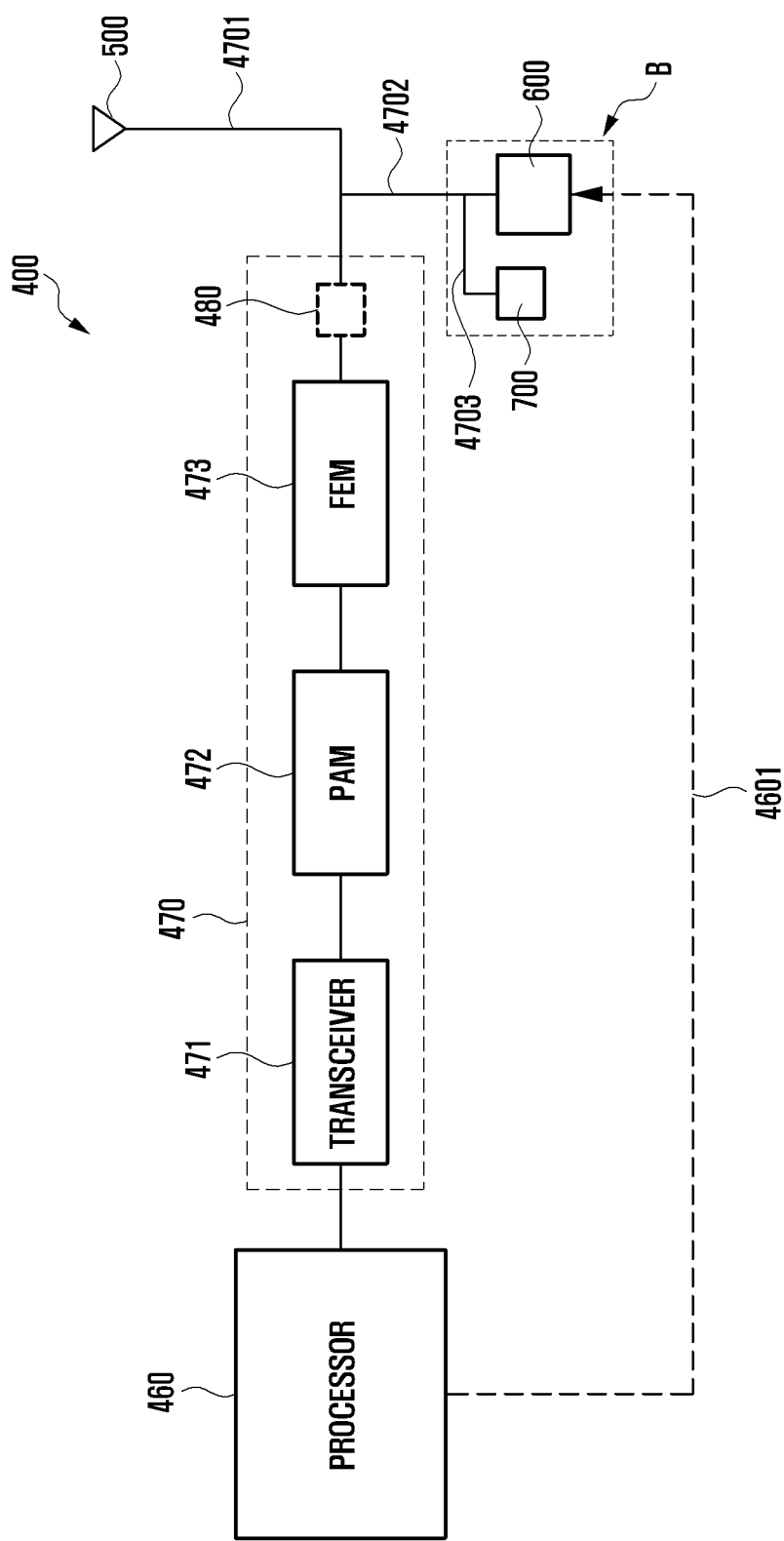
FIG. 5 is a block diagram illustrating an electronic device including an antenna structure according to an embodiment of the disclosure.

FIG. 5 is a block diagram illustrating an electronic device 400 including an antenna structure 500 according to an embodiment of the disclosure.

Referring to FIG. 5, the electronic device 400 may include a processor 460 (e.g., the processor 120 in FIG. 1), a communication unit 470 (e.g., the wireless communication module 192 in FIG. 1, or a wireless communication circuit), the antenna structure 500, a tunable circuit 600, and/or at least one low-resistance circuit 700. According to an embodiment, the processor 460 may perform the overall control operation of the electronic device 400, such as controlling wireless transmission/reception. According to an embodiment, the processor 460 may control the tunable circuit 600 to establish an electrical path to enable communication in at least one frequency band, selected for wireless transmission/reception from among multiple bands, through the antenna structure 500. The processor 460 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. § 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

According to an embodiment, the communication unit 470 may transmit and receive communication signals (e.g., RF signals). According to an embodiment, the communication unit 470 may include a transceiver 471, a power amp module (PAM) 472, and/or a front end module (FEM) 473. According to an embodiment, the communication unit 470 may further include at least one matching circuit 480 or tuner disposed on a first electrical path 4701 connected to the antenna structure 500. According to an embodiment, the matching circuit 480 may include one or more passive elements connected in parallel or in series to each other. According to an embodiment, such a passive element may include an inductor (L) and/or a capacitor (C). According to an embodiment, the transceiver 471 may perform modulation of RF signals to be transmitted or demodulation of received RF signals. According to an embodiment, the PAM 472 may amplify the modulated signal or the demodulated signal. According to an embodiment, the FEM 473 may separate and filter the amplified transmission/reception signals, deliver the transmission signal from the transceiver 471 to the antenna structure 500, and deliver the reception signal from the antenna structure 500 to the transceiver 471. Although not shown, the electronic device 400 may include a memory connected to the processor. According to an embodiment, the memory may store switching information for switching the tunable circuit 600 connected to the antenna structure 500, based on communication environments of the electronic device 400. For example, the memory may store instructions that control the changing of the operating frequency band from a first frequency band to a second frequency band in accordance with variations in communication environments such as a service provider change of the electronic device 400, a service area change of the electronic device 400, and/or a gripping state of the electronic device 400 (e.g., hand placement on the electronic device 400).

According to an embodiment, the electronic device 400 may include the first electrical path 4701 electrically connecting the communication unit 470 and the antenna structure 500. According to an embodiment, the electronic device 400 may include the at least one matching circuit 480 contained in the communication unit 470 and disposed on the first electrical path 4701. In another embodiment, the at least one matching circuit 480 may be disposed on the first electrical path 4701 and/or a second electrical path 4702. According to an embodiment, the electronic device 400 may include the tunable circuit 600 (e.g., a tunable IC) that is connected to the first electrical path 4701 in parallel and is disposed on the second electrical path 4702 electrically connected to the ground (G). According to an embodiment, the second electrical path 4702 may be branched from the first electrical path 4701 at a point between the matching circuit 480 and the antenna structure 500. In another embodiment, the second electrical path 4702 may be branched at a point on the first electrical paths 4701 between the communication unit 470 and the matching circuit 480.

According to an embodiment, the electronic device 400 may include the low-resistance circuit 700 that is connected to the second electrical path 4702 in parallel and is disposed on a third electrical path 4703 electrically connected to the ground (G). According to an embodiment, the third electrical path 4703 may be branched from the second electrical path 4702 at a point between the first electrical path 4701 and the tunable circuit 600. According to an embodiment, the low-resistance circuit 700 may be connected to the tunable circuit 600 in parallel.

According to an embodiment, the processor 460 may provide a control signal 4601 to the tunable circuit 600 such that the frequency of the antenna structure 500 is shifted to a band corresponding to a currently detected environment of the electronic device 400. According to an embodiment, the communication unit 470, the matching circuit 480, the tunable circuit 600, and/or the low-resistance circuit 700 may be disposed on a first PCB (e.g., the first PCB 431 in FIG. 4) or a second PCB (e.g., the second PCB 432 in FIG. 4).

According to an embodiment, the tunable circuit 600 may include at least one element (e.g., a switch 610 in FIG. 6B) having a constant resistance value (Ron). According to an embodiment, the low-resistance circuit 700 may include at least one resistor. According to an embodiment, the low-resistance circuit 700 may be connected in parallel with the at least one element (e.g., the switch 610 in FIG. 6B) of the tunable circuit 600. Thus, the total resistance connected to the antenna structure 500 may be lower than the internal resistance value (Ron) of the element inside the tunable circuit 600, and also the gain of the antenna structure 500 may be increased.

Now, the tunable circuit 600 and the low-resistance circuit 700 connected thereto will be described in detail.

Figure 6A:
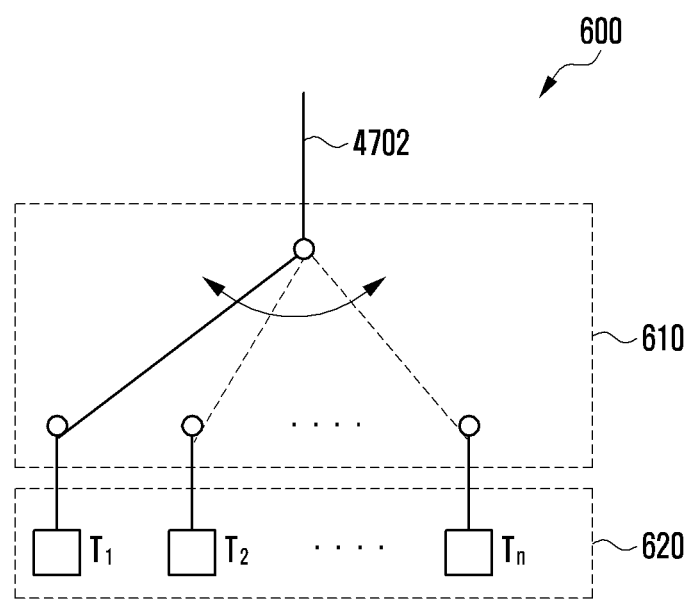
FIG. 6A is a schematic view showing a configuration of the tunable circuit shown in FIG. 5.

FIG. 6A is a schematic view showing a configuration of the tunable circuit 600 shown in FIG. 5. Referring to FIG. 6A, the tunable circuit 600 may include a switch 610 and one or more lumped elements 620 (e.g., $T_1, T_2, \ldots, T_n$) selectively connected to the second electrical path 4702 by the switch 610. According to an embodiment, the switch 610 may connect one of the lumped elements 620 to the second electrical path 4702 under the control of a processor (e.g., the processor 460 in FIG. 4). According to an embodiment, the switch 610 may be a single pole single throw (SPST) switch, a single pole double throw (SPDT) switch, or a switch having three or more throws.

According to an embodiment, the tunable circuit 600 may have an internal resistance value (e.g., a first resistance value) caused by the switch structure. Nevertheless, when a low-resistance circuit (e.g., the low-resistance circuit 700 in FIG. 5) having a specific resistance value (e.g., a second resistance value) is connected to the second electrical path 4702 in parallel, the total resistance value may be lowered. As a result, the gain of the antenna structure (e.g., the antenna structure 500 in FIG. 5) may be improved.

Figure 6B:
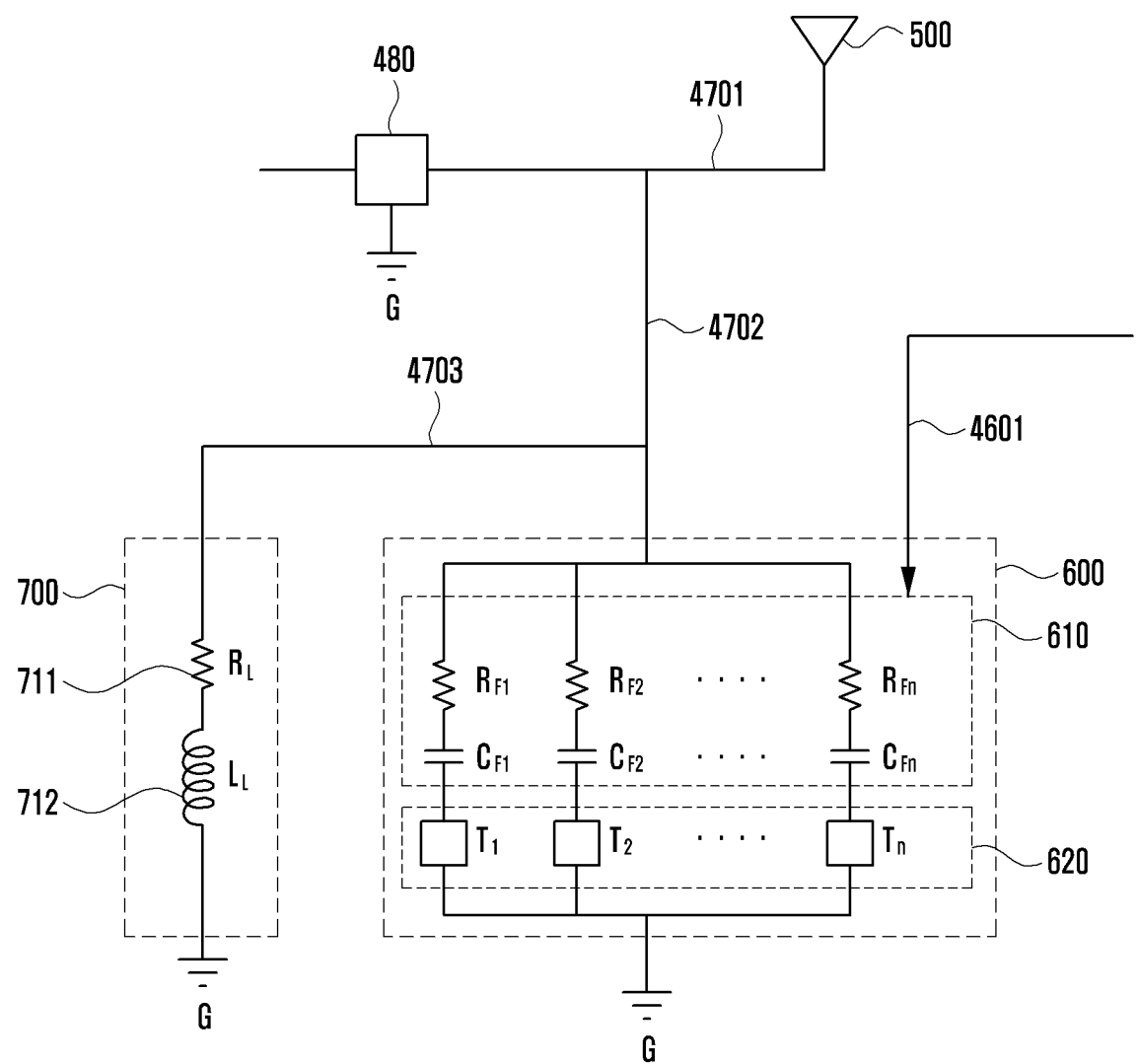
FIG. 6B is an equivalent circuit diagram illustrating the region B of FIG. 5.

FIG. 6B is an equivalent circuit diagram illustrating the region B of FIG. 5.

Referring to FIG. 6B, the tunable circuit 600 may be disposed on the second electrical path 4702 that is branched from the first electrical path 4701 that connects a communication unit (e.g., the communication unit 470 in FIG. 5) to the antenna structure 500. The second electrical path 4702 is electrically connected to the ground (G). According to an embodiment, the tunable circuit 600 may include the switch 610 and the one or more lumped elements 620 (e.g., $T_1, T_2, \ldots, T_n$) selectively connected to the second electrical path 4702 through the switch 610. According to an embodiment, each of the one or more lumped elements 620 may include an inductor (L) and/or a capacitor (C). According to an embodiment, the switch 610 may be implemented in the form of a field effect transistor (FET) module including one or more FET elements. According to an embodiment, the switch 610 may operate such that one of the one or more lumped elements ($T_1, T_2, \ldots, T_n$) is connected to the second electrical path 4702 through a control signal 4601 applied from a processor (e.g., the processor 460 in FIG. 5). According to an embodiment, when a bias voltage is applied to any one FET element of the switch, the other FET elements may remain off. In this case, the other FET elements may have parasitic capacitance. There is a trade-off between such a parasitic capacitance value (Coff, e.g., $C_{F1}, C_{F2}, \ldots, C_{Fn}$) and the total resistance value ($R_F$) generated from at least one internal resistance value (Ron, e.g., $R_{F1}, R_{F2}, \ldots, R_{Fn}$) of the switch 610 of the tunable circuit 600. For example, when the internal resistance value (Ron or $R_F$) of the tunable circuit 600 is lowered, the parasitic capacitance value (Coff) becomes high. This may cause difficulty in obtaining a desired frequency shift. In addition, the internal resistance value ($R_F$) of the tunable circuit 600, set higher relatively, may lower the gain of the antenna structure 500.

According to an embodiment of the disclosure, the electronic device (e.g., the electronic device 400 in FIG. 5) may include the low-resistance circuit 700. Even if an internal resistance component (i.e., the switch element) of the tunable circuit 600 has a high internal resistance value ($R_F$) in order to lower the parasitic capacitance value of the tunable circuit 600, the total resistance ($R_T$) is kept low by means of the low-resistance circuit 700 from the viewpoint of the antenna structure 500. Therefore, the low-resistance circuit 700 can improve the gain of the antenna structure 500. According to an embodiment, the low-resistance circuit 700 may be disposed on the third electrical path 4703 that is branched from the second electrical path 4702 and electrically connected to the ground (G). According to an embodiment, the low-resistance circuit 700 may include a resistor 711 disposed in series on the third electrical path 4703 and having a constant resistance value ($R_L$). According to an embodiment, the low-resistance circuit 700 may further include an inductor 712 disposed between the resistor 711 and the ground (G) on the third electrical path 4703 and having a constant inductance value ($L_L$). According to an embodiment, the resistor 711 of the low-resistance circuit 700 is connected in parallel with the tunable circuit 600, thus lowering the total resistance ($R_T$) and improving the gain of the antenna structure 500. According to an embodiment, the inductor 712 may induce the low-resistance circuit 700 to be seen as open at certain RF frequencies where the antenna structure 500 operates.

For example, the total resistance ($R_T$) from the viewpoint of the antenna structure 500 may be calculated through Equation 1 below.

$$R_T = \frac{(R_F \times R_L)}{(R_F + R_L)} \quad \text{[Equation 1]}$$

In Equation 1, '$R_T$' denotes the total resistance value from the viewpoint of the antenna structure 500. In addition, '$R_F$' denotes the internal resistance value of the tunable circuit 600, and '$R_L$' denotes the resistance value of the resistor 711 contained in the low-resistance circuit 700.

According to an embodiment, in order for the total resistance value ($R_T$) to be meaningful from the viewpoint of the antenna structure 500, the resistance value ($R_L$) of the resistor 711 of the low-resistance circuit 700 may be determined in a range of about 0.3~3 times the internal resistance value ($R_F$) of the tunable circuit 600. The resistance value ($R_L$) of the resistor 711 of the low-resistance circuit 700 should be designed at least so that the radiation efficiency of the antenna structure 500 exhibits the gains shown in FIGS. 7A and 7B. According to an embodiment, in order for the low-resistance circuit 700 to be seen as open from the viewpoint of the antenna structure 500 at desired frequencies, the inductance value ($L_L$) of the inductor 712 of the low-resistance circuit 700 may be determined to be about twice or more of the inductance value of the lumped element 620 (e.g., $T_1, T_2, \ldots, T_n$). The inductance value ($L_L$) of the inductor 712 of the low-resistance circuit 700 should be designed at least so that the radiation efficiency of the antenna structure 500 exhibits the gains shown in FIGS. 7A and 7B.

Figure 7A:
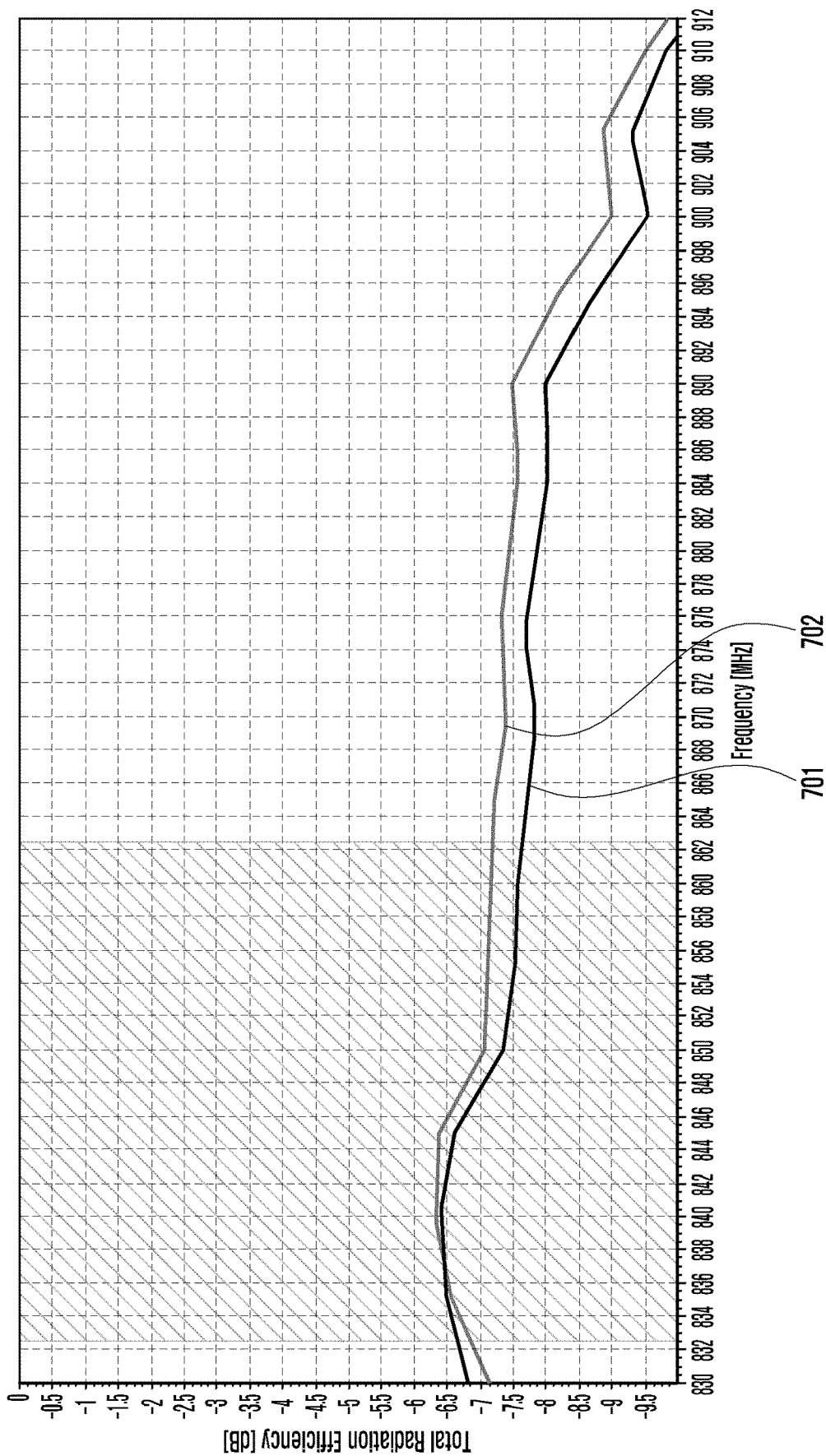
FIGS. 7A and 7B are graphs showing radiation efficiency of an antenna structure depending on the presence or absence of a low-resistance circuit according to an embodiment of the disclosure.
Figure 7B:
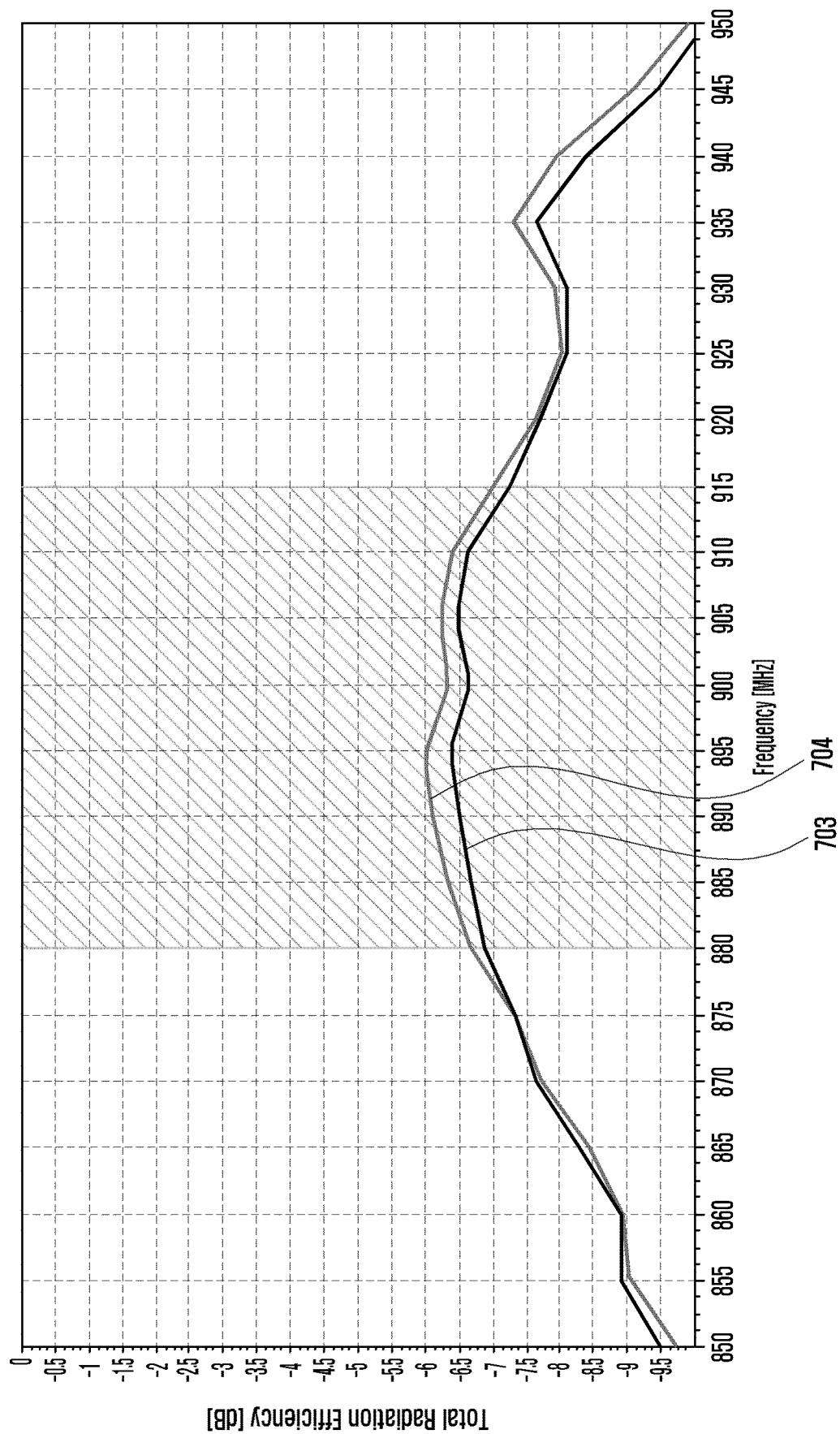

FIGS. 7A and 7B are graphs showing radiation efficiency of an antenna structure 500 depending on the presence or absence of a low-resistance circuit 700 according to certain embodiments of the disclosure.

FIG. 7A shows the efficiency of the antenna structure 500 operating in a first frequency band (e.g., LB20 Band) under the control of the tunable circuit 600 through the processor 460. It can be seen that the radiation efficiency (denoted by 702) when the low-resistance circuit 700 is applied is improved generally by about 0.5 dBm or more, compared to the radiation efficiency (denoted by 701) when the low-resistance circuit 700 is not present.

FIG. 7B shows the efficiency of the antenna structure 500 operating in a second frequency band (e.g., EGSM Band), which is higher than the first frequency band, under the control of the tunable circuit 600. It can be seen that the radiation efficiency (denoted by 704) when the low-resistance circuit 700 is applied is improved generally by about 0.5 dBm or more, compared to the radiation efficiency (denoted by 703) when the low-resistance circuit 700 is not present.

Therefore, when the low-resistance circuit 700 connected in parallel between the antenna structure 500 and the tunable circuit 600 is used, the gain of the antenna structure 500 is improved while the operating frequency band of the antenna structure 500 can be easily shifted using the tunable circuit 600.

According to certain embodiments of the disclosure, the low-resistance circuit connected in parallel to at least one internal resistance component included in an intermediate circuit (e.g., the tunable circuit or tuner) disposed for a frequency shift of the antenna can lower the total resistance value. This increases the antenna gain and also improves the radiation performance of the antenna.

According to an embodiment of the disclosure, an electronic device (e.g., the electronic device 400 in FIG. 4) may include a housing (e.g., the housing 410 in FIG. 4) having an inner space (e.g., the inner space 4001 in FIG. 4), a first printed circuit board (PCB) (e.g., the first PCB 431 in FIG. 4) disposed in the inner space of the housing and including a wireless communication circuit (e.g., the communication unit 470 in FIG. 5), an antenna structure (e.g., the antenna structure 500 in FIG. 6B) connected to the wireless communication circuit through a first electrical path (e.g., the first electrical path 4701 in FIG. 6B), and a tunable circuit (e.g., the tunable circuit 600 in FIG. 6B) having a first resistance value (e.g., the internal resistance value ($R_F$) in FIG. 6B) and disposed on a second electrical path (e.g., the second electrical path 4702 in FIG. 6B) branched from the first electrical path and connected to a ground (e.g., the ground (G) in FIG. 6B). The electronic device may further include a low-resistance circuit (e.g., the low-resistance circuit 700 in FIG. 6B) disposed on a third electrical path (e.g., the third electrical path 4703 in FIG. 6B) branched from the second electrical path and connected to the ground, and including a resistor (e.g., the resistor 711 in FIG. 6B) and an inductor (e.g., the inductor 712 in FIG. 6B), the resistor having a second resistance value (e.g., the resistance value ($R_L$) in FIG. 6B) determined based on the first resistance value, and the inductor having a constant inductance value and disposed between the resistor and the ground. The electronic device may also include at least one processor (e.g., the processor 460 in FIG. 5) configured to control the tunable circuit to enable the wireless communication circuit to transmit and/or receive a wireless signal through a second frequency band shifted from a first frequency band using the antenna structure.

According to an embodiment, the second resistance value of the low-resistance circuit may be determined to be in a range of about 0.3~3 times the first resistance value of the tunable circuit.

According to an embodiment, the third electrical path may be branched from the second electrical path at a point between the first electrical path and the tunable circuit.

According to an embodiment, the tunable circuit may include a switch (e.g., the switch 610 in FIG. 6B) having the first resistance value, and one or more lumped elements (e.g., the lumped elements 620 in FIG. 6B) selectively connected to the antenna structure through the switch.

According to an embodiment, the inductance value of the inductor of the low-resistance circuit may be determined to be about twice or more of an inductance value of the one or more lumped elements.

According to an embodiment, the electronic device may further include at least one matching circuit (e.g., the matching circuit 480 in FIG. 6B) disposed on the first electrical path.

According to an embodiment, the second electrical path may be branched from the first electrical path at a point between the antenna structure and the at least one matching circuit.

According to an embodiment, the second electrical path may be branched from the first electrical path at a point between the wireless communication circuit and the at least one matching circuit.

According to an embodiment, the tunable circuit and/or the low-resistance circuit may be disposed on the first PCB.

According to an embodiment, the electronic device may further include a second PCB (e.g., the second PCB 432 in FIG. 4) disposed in the inner space of the housing, spaced apart from the first PCB, and connected to the first PCB through an electrical connection member (e.g., the electrical connection member 440 in FIG. 4), and the antenna structure may be disposed on the second PCB.

According to an embodiment, the electrical connection member may include a radio frequency (RF) coaxial cable or a flexible PCB (FPCB)-type RF cable (FRC).

According to an embodiment, the antenna structure may include a laser direct structuring (LDS) pattern disposed on a dielectric structure disposed in the inner space of the housing.

According to an embodiment, the housing may include a lateral surface including a conductive member, and the antenna structure may include at least one conductive portion of the conductive member, electrically isolated from a remaining portion of the conductive member through at least one non-conductive portion.

According to an embodiment of the disclosure, an electronic device (e.g., the electronic device 400 in FIG. 4) may include a housing (e.g., the housing 410 in FIG. 4) having an inner space (e.g., the inner space 4001 in FIG. 4), a printed circuit board (PCB) (e.g., the first PCB 431 in FIG. 4) disposed in the inner space of the housing and including a wireless communication circuit (e.g., the communication unit 470 in FIG. 5), an antenna structure (e.g., the antenna structure 500 in FIG. 6B) electrically connected to the wireless communication circuit, and at least one intermediate circuit (e.g., the tunable circuit 600 in FIG. 6B) having a first resistance value (e.g., the internal resistance value ($R_F$) in FIG. 6B), connected to the antenna structure in parallel to the wireless communication circuit, and grounded to a ground (e.g., the ground (G) in FIG. 6B). The electronic device may further include a low-resistance circuit (e.g., the low-resistance circuit 700 in FIG. 6B) connected to the at least one intermediate circuit in parallel, grounded to the ground, and including a resistor (e.g., the resistor 711 in FIG. 6B) and an inductor (e.g., the inductor 712 in FIG. 6B), the resistor having a second resistance value (e.g., the resistance value ($R_L$) in FIG. 6B) determined based on the first resistance value, and the inductor having a constant inductance value and disposed between the resistor and the ground.

According to an embodiment, the second resistance value of the low-resistance circuit may be determined to be in a range of about 0.3~3 times the first resistance value of the at least one intermediate circuit.

According to an embodiment, the at least one intermediate circuit may include a tuner or a tunable circuit.

According to an embodiment, the at least one intermediate circuit may include a switch (e.g., the switch 610 in FIG. 6B) having the first resistance value, and one or more lumped elements (e.g., the lumped elements 620 in FIG. 6B) selectively connected to the antenna structure through the switch.

According to an embodiment, the electronic device may further include at least one processor (e.g., the processor 460 in FIG. 5) configured to control the at least one intermediate circuit to enable the wireless communication circuit to transmit and/or receive a wireless signal through a second frequency band shifted from a first frequency band using the antenna structure.

According to an embodiment, the inductance value of the inductor of the low-resistance circuit may be determined to be about twice or more of an inductance value of the one or more lumped elements.

According to an embodiment, the at least one intermediate circuit and/or the low-resistance circuit may be disposed on the PCB.

Certain of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

While the disclosure has been particularly shown and described with reference to exemplary embodiments thereof, it will be understood by those skilled in the art that various changes in form and details may be made therein without departing from the scope of the subject matter as defined by the appended claims.

What is claimed is:
1. An electronic device comprising:
a housing;
a first printed circuit board (PCB) disposed in an inner space of the housing and including a wireless communication circuit;
an antenna structure connected to the wireless communication circuit through a first electrical path;
a tunable circuit having a first resistance value and disposed on a second electrical path branched from the first electrical path and connected to a ground;

a low-resistance circuit disposed on a third electrical path branched from the second electrical path and connected to the ground, and including a resistor and an inductor, the resistor having a second resistance value determined based on the first resistance value, and the inductor having a constant inductance value and disposed between the resistor and the ground; and at least one processor configured to control the tunable circuit to enable the wireless communication circuit to transmit and/or receive a wireless signal through a second frequency band shifted from a first frequency band using the antenna structure.

2. The electronic device of claim 1, wherein the second resistance value of the low-resistance circuit is determined to be in a range of about 0.3~3 times the first resistance value of the tunable circuit.

3. The electronic device of claim 1, wherein the third electrical path is branched from the second electrical path at a point between the first electrical path and the tunable circuit.

4. The electronic device of claim 1, wherein the tunable circuit includes:
a switch having the first resistance value; and
one or more lumped elements selectively connected to the antenna structure through the switch.

5. The electronic device of claim 4, wherein the inductance value of the inductor of the low-resistance circuit is determined to be about twice or more of an inductance value of the one or more lumped elements.

6. The electronic device of claim 1, further comprising:
at least one matching circuit disposed on the first electrical path.

7. The electronic device of claim 6, wherein the second electrical path is branched from the first electrical path at a point between the antenna structure and the at least one matching circuit.

8. The electronic device of claim 6, wherein the second electrical path is branched from the first electrical path at a point between the wireless communication circuit and the at least one matching circuit.

9. The electronic device of claim 1, wherein the tunable circuit and/or the low-resistance circuit are disposed on the first PCB.

10. The electronic device of claim 1, further comprising:
a second PCB disposed in the inner space of the housing, spaced apart from the first PCB, and connected to the first PCB through an electrical connection member,
wherein the antenna structure is disposed on the second PCB.

11. The electronic device of claim 10, wherein the electrical connection member includes a radio frequency (RF) coaxial cable or a flexible PCB (FPCB)-type RF cable (FRC).

12. The electronic device of claim 1, wherein the antenna structure includes a laser direct structuring (LDS) pattern disposed on a dielectric structure disposed in the inner space of the housing.

13. The electronic device of claim 1, wherein the housing includes a lateral surface including a conductive member, and
wherein the antenna structure includes at least one conductive portion of the conductive member, electrically isolated from a remaining portion of the conductive member through at least one non-conductive portion.

14. An electronic device comprising:
a housing having an inner space;
a printed circuit board (PCB) disposed in the inner space of the housing and including a wireless communication circuit;
an antenna structure electrically connected to the wireless communication circuit;
at least one intermediate circuit having a first resistance value, connected to the antenna structure in parallel to the wireless communication circuit, and grounded to a ground; and
a low-resistance circuit connected to the at least one intermediate circuit in parallel, grounded to the ground, and including a resistor and an inductor, the resistor having a second resistance value determined based on the first resistance value, and the inductor having a constant inductance value and disposed between the resistor and the ground.

15. The electronic device of claim 14, wherein the second resistance value of the low-resistance circuit is determined to be in a range of about 0.3~3 times the first resistance value of the at least one intermediate circuit.

16. The electronic device of claim 14, wherein the at least one intermediate circuit includes a tuner or a tunable circuit.

17. The electronic device of claim 14, wherein the at least one intermediate circuit includes:
a switch having the first resistance value; and
one or more lumped elements selectively connected to the antenna structure through the switch.

18. The electronic device of claim 17, wherein the inductance value of the inductor of the low-resistance circuit is determined to be about twice or more of an inductance value of the one or more lumped elements.

19. The electronic device of claim 14, further comprising:
at least one processor configured to control the at least one intermediate circuit to enable the wireless communication circuit to transmit and/or receive a wireless signal through a second frequency band shifted from a first frequency band using the antenna structure.

20. The electronic device of claim 14, wherein the at least one intermediate circuit and/or the low-resistance circuit are disposed on the PCB.

* * * * *